United States Patent [19]

Fudaley

[11] 3,967,261

[45] June 29, 1976

[54] PROXIMITY SENSOR WITH SIMULTANEOUSLY ACTIVE INTERMIXED SENSOR TYPES

[76] Inventor: Solly L. Fudaley, 12437 S. 80th Ave., Palos Park, Ill. 60604

[22] Filed: Oct. 10, 1974

[21] Appl. No.: 513,521

[52] U.S. Cl. .......................... 340/258 C; 340/267 R
[51] Int. Cl.² ....................................... G08B 13/18
[58] Field of Search ............ 340/258 C, 258 D, 285, 340/279, 267 R, 420

[56] References Cited
UNITED STATES PATENTS

| | | | |
|---|---|---|---|
| 2,963,627 | 12/1960 | Buchsbaum | 340/258 C |
| 3,573,783 | 4/1971 | Fudaley | 340/258 C |
| 3,613,064 | 10/1971 | Peterson et al. | 340/420 |
| 3,636,542 | 1/1972 | Apple | 340/258 D |
| 3,731,294 | 5/1973 | Vass | 340/420 |

*Primary Examiner*—Glen R. Swann, III
*Attorney, Agent, or Firm*—Laff, Whitesel & Rockman

[57] ABSTRACT

The invention provides an improvement over my earlier U.S. Pat. No. 3,573,783 whereby different types of sensors may be indiscriminately intermingled, intermixed or otherwise used together simultaneously, in the same proximity sensing systems. An antenna sensor may be used when line of sight detection is not appropriate. A photosensor may be used when line of sight detection may be used. Both types of sensors may be used simultaneously, or each may be used separately. The invention is broad enough to enable simultaneous use of almost any other types of sensors. This intermixture is achieved by use of a balanced bridge-like circuit which may be unbalanced either by an intrusion, movement, or exit or any person or object in the field of an antenna or by a snap-action-like sensor, such as a photocell, for example.

10 Claims, 5 Drawing Figures

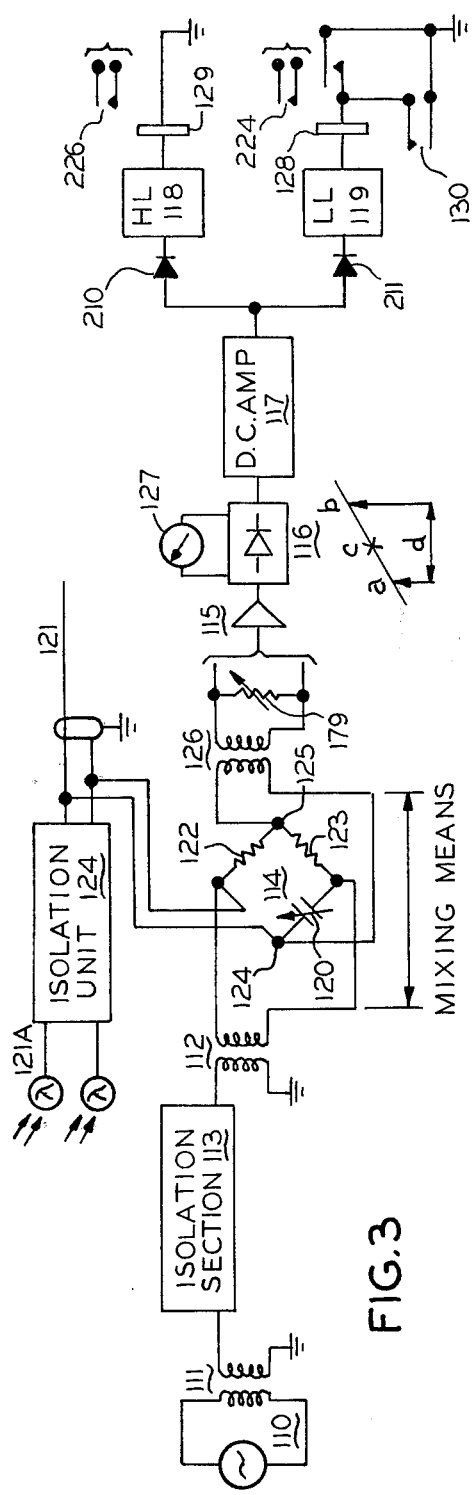
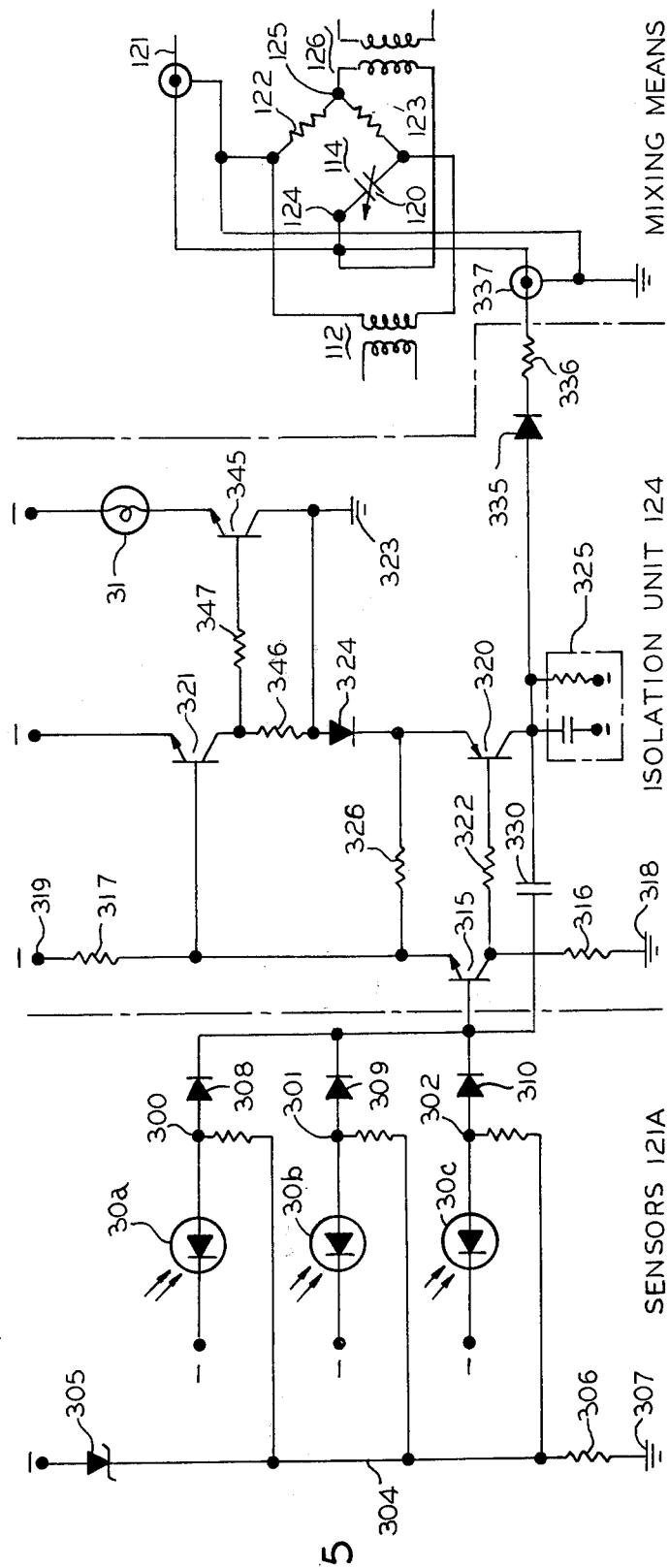
FIG. 3
FIG. 5

PROXIMITY SENSOR WITH SIMULTANEOUSLY ACTIVE INTERMIXED SENSOR TYPES

BACKGROUND OF THE INVENTION

This invention relates to proximity sensors and more particularly to an indiscriminate and intermingled use of almost any type of sensors especially—although not exclusively—well adapted to control an automatic shutdown of machine tools, primarily for the protection of the human operators.

Recent Federal legislation requires machine tools to be controlled in a prescribed manner whenever there is a safety hazzard to the worker. Thus, for example, a punch press must be prevented from closing when a worker's hands are too near the moving parts. Since an automatic machine shutdown is desirable to protect the worker, it is also desirable to use the same equipment to protect the machine from damaging itself. For example, a part stuck in a die, or a raw stock which does not properly feed could ruin an expensive tool and die. Thus, it is desirable to prevent the machine from operating if either of these malfunctions should occur.

Another consideration is that no one sensor is able to serve all proximity detection needs in a simple and efficient manner. For example, if a sensor is to detect a person entering a door, a simple light beam across the door is sufficient. On the other hand, if the detector is to detect a person on a spiral staircase, the light beam is almost totally inadequate since it would have to be duplicated for nearly every stair tread. Likewise, those skilled in the art will readily perceive when still other forms of sensors are to be desired.

I have taught the use of an antenna sensor in my earlier U.S. Pat. No. 3,573,783, granted Apr. 6, 1971. That sensor functions very well and has enjoyed commercial success. However, it tends to become unduly complex under some conditions, as when a light beam sensor, for example, is more adequate than an antenna. On the other hand, an antenna is preferable to a light beam sensor if line of sight detection is not desirable or adequate to system needs.

SUMMARY OF THE INVENTION

Accordingly, an object of this invention is to provide a new and improved proximity sensor which may use any of a number of different types of sensors, either individually or intermixed.

Another object is to provide a sensor which complies with Federal safety legislation for machine tools regardless of the form of sensor which is best suited for a given need.

Still another object is to provide greater flexibility in the selection and use of different proximity sensor types.

In keeping with an aspect of the invention taught in my earlier U.S. Pat. No. 3,573,783, an antenna-type sensor is fed from a stable low frequency source of signals. The antenna establishes a low frequency field around the boundary of an area which is protected by the sensor. The antenna is connected to an electrical bridge circuit, arranged to give an unbalanced signal to cause a suitable alarm or otherwise control a function when the antenna field is upset by an intruding person or object. This way, an extremely critical balance may be built into the bridge so that detection is made by a hair trigger snap-action-like response to the slightest stimulus upsetting of the boundary field.

In keeping with the present improvement, a plurality of other sensors are connected into the bridge circuit which enables anyone of many different types of sensors to unbalance the bridge in a manner which operates an associated detection circuit. Thus, any number of different types of sensors may be intermingled, intermixed, or otherwise used together indiscriminately, depending upon specific needs of any given installation.

BRIEF DESCRIPTION OF DRAWINGS

A preferred embodiment of the invention is shown in the attached drawing wherein:

FIG. 3 is a block diagram taken from my prior patent;

FIG. 5 is a schematic circuit diagram of the circuit which enables an indiscriminate intermingling of other types of sensors, which may be used in conjunction with the antenna sensor of my prior patent.

DESCRIPTION OF PREFERRED EMBODIMENTS

Figure 1:
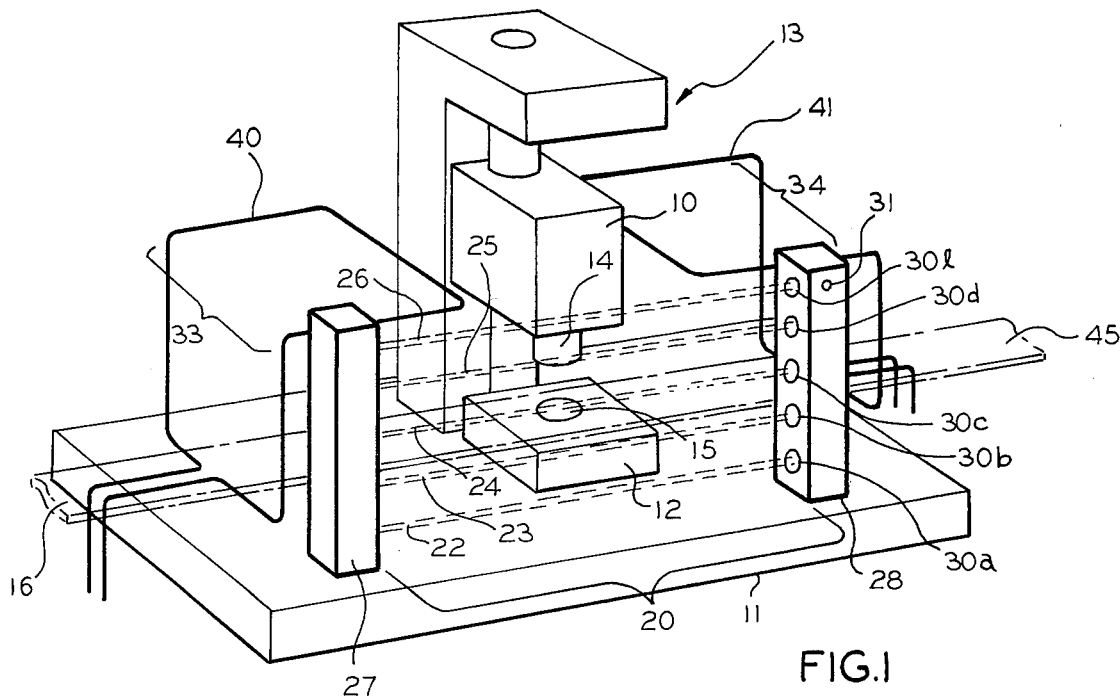
FIG. 1 is a schematic view of an exemplary punch press requiring a combination of light and antenna sensors.

FIG. 1 is here shown as exemplary of both the problems caused by the Federal safety regulations and by the self monitoring requirements of the machine. In greater detail, FIG. 1 includes a schematic representation of the ram 10 and table 11 of a punch press 13. A die block 12 rests on and is clamped to table 11. When the ram 10 operates, a punch 14 enters an opening 15 in die block 12 in order to shear out a blank from a ribbon of stock material 16, such as a ribbon of steel, brass, or the like.

The representation of FIG. 1 illustrates three problem areas for proximity sensing. First, and most obvious, the person operating the punch press must not have his hands or clothing under punch 14 when the press 13 closes. Second, no one else standing near by should have their hands or clothing under punch 14, either. Third, the machine should detect its own failure and stop its operations before harm can be done.

On the first problem (operator detection), it is assumed that the operator sits in front of the press 13 and moves his hands into and out of the press over the table area generally indicated by bracket 20. The area should be free and clear of all obstructions which might snag a sleeve, catch a hand or the like. Also, the worker should not have to undertake any awkward motion, such as having to lift parts over or fit his hands under a sensor, such as an antenna. Finally, the entire area represented by the bracket should be protected so that there is no danger of the worker having his hands too high or too low to be sensed. For these and other reasons it is not always wise to string an antenna around the entire working area.

For this type of sensing, a wall of light comprising many parallel beams 22-26 is ideal. No matter where the worker places his hands in the area, he must cut at least one beam of light. Thus two widely spaced light fixtures 27, 28, may be placed far enough apart to insure against any interference with the worker's activities. An aligned plurality of lamps in first fixture 27 are directed toward a similarly aligned plurality of photocells 30. Accordingly, a light or other signal 31 should be provided to indicate that the light sensor fixtures 27, 28 are aligned and functioning properly.

The second problems occur when someone (usually not the operator) places his hands under the punch 13 from a position other than the operator position. This might happen on the sides 33, 34, as when someone feeds the ribbon 16 of stock under the punch 14, when someone attempts to free a jammed part from die block 12, or the like. Here the problem is different since the direction and location of the intrusion cannot be predicted. It is not like an operator sitting in front of the table 11. Someone could stand behind, beside, or even hang over the punch press 13 while attempting to work in the danger area. Therefore, it would be difficult and impractical to cross all of the possible entrance paths with the light beams.

For this second problem, the antenna provides an ideal solution since it may be wrapped around corners, over humps, and the like. Therefore, the two antennas 40, 41 have been drawn to surround the entire area and virtually every perimeter point where an intrusion may be made upon the punch and die area, except in the worker's gate area which is covered by light beams 22-26.

The third problem is also best solved by the antenna 40, 41 which may be strung over the problem areas in the punch press. Here, by way of example, it is assumed that one likely mechanical failure occurs when the ribbon 16 of stock material does not feed smoothly into or out of the machine. Accordingly, the antennas 40, 41 are strung very close to and under ribbon 16. If there is a feeding problem, for example, the ribbon 16 buckles and moves toward or away from the antenna, thereby upsetting the balance of the bridge. Light sensing in this problem area would not be as successful since buckling of the ribbon is in an unpredictable direction.

If the output end 45 of the ribbon has holes punched into it, the antenna 41 detects a hole in each movement of the ribbon. This hold detection may be fed into the controls of the machine to shut it down if the hole does not appear during the correct interval in the machine's work cycle.

Figure 2:
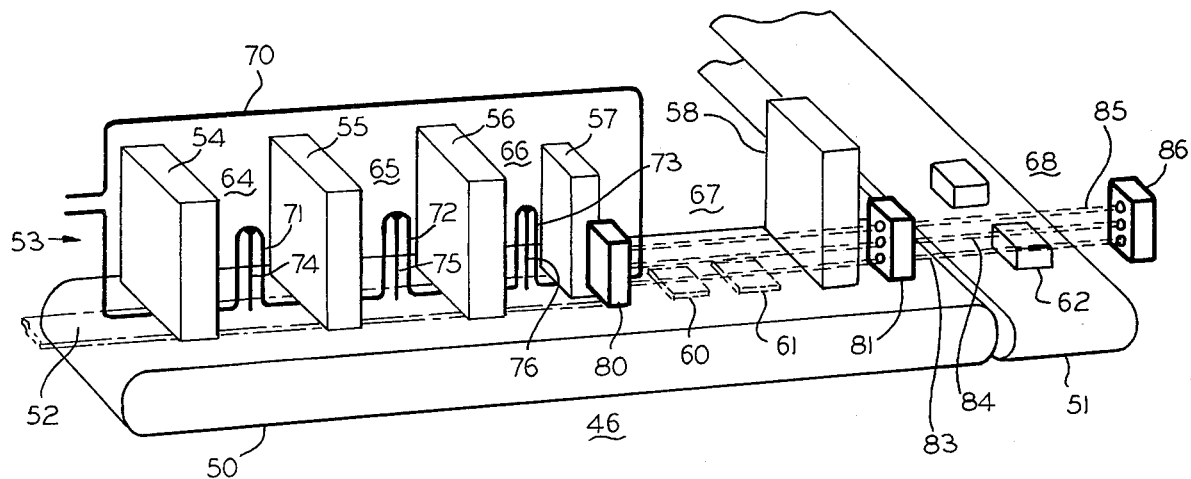
FIG. 2 is a schematic view of a automatic production line requiring a combination of light and antenna sensors.

FIG. 2 indicates another and similar set of problems, by way of furter example. Here, there is an automated production line 46 which is largely unattended. The major concern is proper machine operation. However, there is also a slightly different kind of concern for human safety since the worker does not necessarily live with his machine for 8 hours every day. Instead, he visits it sporadically; therefore, it is not too certain as to what he might or might not do.

In one automated production line, the tooling makes the leaf spring contact pile up for an electromechanical relay. The various work stations successively punch springs, bend and torsion the various springs, weld contacts, and assemble the pileups. For simplicity of drawing, no attempt has been made to show all details of these intricate shapes in the drawings. However, the production line is schematically shown as including conveyors 50, 51 carrying a ribbon of spring material 52 past a plurality of stations 53. These stations comprise a shear 54, bender 55, welder 56, former 57, and assembler 58. To simplify the drawing, the ribbon is here shown as merely being cut into discreet segments 60, 61 before assembly which are stacked into piles at 62 by the assembler 58.

In the stations 54–57, the control problem is to be sure that the machines function properly, by moving the ribbon of raw stock 52 in a desired manner and over a prescribed path. It is assumed that it is almost impossible for anyone to put their hands under or inside dangerous areas of the machines 54–57. However, in the spaces 64–66, the assumed problem is to keep peoples' hands out of the area. To solve these and similar problems, the antenna 70 is strung along the prescribed path which ribbon 52 travels as it wends its way through the production line 46. The antenna can run up into each machine 54–57, over jigs, underheads, etc., exactly as the ribbon 52 runs. If the ribbon deviates from the prescribed path in any manner whatsoever, it is detected.

In the problem areas 64–66, the antenna 70 makes loops 71–73 so that any hands or other foreign objects may be detected if they intrude into areas 64, 65, 66. To avoid long and unguarded spaces of ribbon travel, rods 74–76 may be welded to the antenna 70 and brought into close proximation with the ribbon surface. Thus, after the system is aligned, both the machines 54–57, and open areas 64–66 are protected by the antenna 70.

In the area 67, it is assumed that the ribbon 52 has been cut up into segments 60, 61. Therefore, the electrical conditions sensed by the antenna 70 would vary in a desired manner since the segments 60, 61 produce different coupling into the antenna field, and it would not be desirable to repeatedly detect unbalanced conditions. Therefore the area 67 is protected by the light sensor fixtures 80, 81 (which are about the same as fixtures 27, 28 of FIG. 1.)

In the area 68 the stacks 62 of segments 60, 61 are placed on and then moved away by the conveyor 51. It is assumed that a properly made stack will interrupt light beams 83, 84 but not light beam 85 passing between light sensor fixtures 81, 86. An antenna strung to detect the height of the stack 62 would be an obstacle over conveyor 51 and might be broken by too high a stack.

From a study of FIGS. 1 and 2, it should be obvious that the proximity sensor may be greatly improved if many different types and forms of sensors are used. Also, it should also be apparent that many different forms of sensors—not just an antenna and photosensor—should be used. For example, ultrasonic sensors, feeler gauges, strain gauges, or the like may also be used.

Thus, the invention provides for an intermixed use of an indiscriminate and intermingled plurality of different types of sensors. The invention further uses the electronic circuit portions shown in my earlier U.S. Pat, No. 3,573,783, which circuit is here included as FIGS. 3, 4. Dot-dashed lines divide the circuit of FIG. 4 into the same functional units that are shown by the blocks of FIGS. 3. (Reference may be made to the patent for more information about this circuit).

BRIEF DESCRIPTION OF ELECTRICAL SENSOR CIRCUIT

The proximity sensor (FIG. 3) includes a driving source of low frequency 110, two transformers 111, 112 for isolating a circuit section 113, a balanced antenna bridge circuit 114, a multistate narrow band amplifier 115, a detector 116, a DC amplifier 117, and high and low level response circuits 118, 119 respectively.

The isolation section 113 completely isolates the bridge 114 from its low frequency driving source 110. The low frequency is held very stable irrespective of any balanced or unbalanced conditions in the bridge 114 and other circuits connected thereto. Therefore, the oscillator 110 is very stable, even under the worst conditions which are likely to be encountered during operation.

The bridge 114 has an adjustable element 120 in one arm and an antenna circuit 121 and/or another sensor 121A of any suitable type in aother arm. The other two arms of the bridge 114 are formed by resistors 122, 123. Primarily, the antenna circuit presents a normal impedance which results from the distributed capacitance and inductance of both an antenna and a coaxial cable used to connect the bridge 114 to the antenna 121. The other sensor 121A includes an isolation unit circuit 124 as shown in FIG. 5.

Under conditions selected by an operator as a quiscent state, the capitance 120 is adjusted to almost balance the inductive and capacitive reactance of the antenna 121, together with the isolation unit for the other sensor 121A of FIG. 5. Under the adjusted "balance" condition the potential difference across the points 124, 125 is such that only a small current flows through the primary winding of a transformer 126 used to couple the bridge 114 to the amplifier 115. Since the small current flows in the transformer primary, there is a small signal c out of the amplifier 115 which is detected at 116. An associated 127 gives a reading which indicates a quiescent condition. When the operator observes this quiescent reading, he knows the bridge 114 is in the adjusted balance.

When an object enters (for example) the sensed field, the bridge 114 is unbalanced in one direction, and the current drops toward a point a. When an object leaves (for example) the field, the bridge 114 is unbalanced in the other direction, and the current increases toward point b. Control functions are performed when current drops or raises to points a or b, respectively. An objective of the circuit is to bring the points a or b close together to reduce the distance as much as possible. This means that the fixed signal equivalent current represented by the point c must be maintained with great precision and stability.

The circuit is arranged so that the equipment controlled thereby will not operate unless the high level switch 118 has no output current, and the low level switch 119 does have output current. Thus, the low level relay 128 is normally operated, and the high level relay 129 is normally unoperated.

DETAILED DESCRIPTION

The oscillator 110 includes a pair of PNP transistors 150, 151 coupled in emitter follower and common emitter configurations, respectively. The oscillator circuit also includes a bridge 152 in an arrangement of a type which is sometimes called a twin-T filter. This twin-T type of oscillator circuit is well known and characterized by a very sharp cutoff and narrow band-pass response. An adjustable resistance 153 enables the operator to select a particular frequency of operation. This way, adjacent machine tools may be adjusted to operate at noninterfering frequencies.

The remainder of the oscillator components include a pair of resistors 154, 155 coupled as a voltage divider to provide a base bias for the transistor 150. The resistor 156 is an emitter load for transistor 150. Capacitor 157 provides an AC coupling between the emitter output of transistor 150 and the base of transistor 151. The resistor-capacitor circuit 158 provides both a bias and a degenerative feedback control for the transistor 151. The resistor 159 is a voltage dropping circuit. The capacitor 160 provides a decoupling for the power supply. The connection 161 provides a phase shift feedback for causing the circuit 110 to go into oscillation.

The primary winding of the transformer 111 acts both as an RF frequency choke coil and a transformer coupling between the oscillator 110 and the isolation section 113. The coupling capacitor 163 prevents the low DC resistance of the secondary winding of the transformer 111 from short-circuiting the bias circuit.

As those skilled in the art know, the oscillator circuit 110 goes into oscillation because the signal applied to the base of transistor 115 goes through a 180° phase shift by the time that it reaches the twin-T filter 152. In the filter, it experiences another phase shift of approximately 180°. Hence, the signal which is fed back over the wire 161 to the base of transistor 150 has undergone a phase shift of about 360° to reinforce the voltage swing at the emitter. This causes the circuit to go into oscillation.

The isolation section 113 is completed by a PNP transistor 164 having a load which is divided between the emitter and collector circuits. The resistors 166, 167 form a voltage divider for applying a base bias to the transistor 164. The resistor 168 acts as a collector load, and the inductance of the primary winding of transformer 112 acts as an emitter load. Isolation section 113 is designed to efficiently transmit the low frequency signals from the oscillator 110 to the antenna bridge 114. However, nothing which happens in the bridge circuit 114 can be transmitted to or otherwise produce any effect upon the output of the oscillator 110. Hence, the low frequency output signal is maintained very stable.

The low frequency oscillator output signal is applied through the transformer 112 to the antenna bridge circuit 114 where capacitor 120 is adjusted to almost balance the distributed inductance and capacitance of the coaxial cable and the antenna 121. The adjustable potentiometer 171 supplements the resistance 123 and makes it exactly equal to the resistor 122.

If any object now enters or leaves the low frequency boundary field set up by the antenna circuit 121, its impedance is changed and the adjusted balance of the bridge is upset. Before upset, and while the bridge is in the adjusted balance only a small current flows through the primary winding of the transformer 126, and a small voltage is induced in its secondary winding. By definition, that small voltage is a quiescent signal. After the adjusted balance of the bridge 114 is upset, the impedances 120, 121 are no longer in the same relative balance, and the difference in potential across the points 124, 125 changes. Hence, more or less current flows through the primary winding of the transformer 126, and the amplifier 115 receives a change of input voltage which, in turn, causes changes in output voltage.

In order to explain the problems related to this depth of field adjustment, it is helpful to assign actual values to a number of voltages which appear in the circuit. An effort has been made to choose voltages which might reasonably be expected in some systems. However, the choice has also had to be somewhat general so that it is equally applicable to many different systems. Therefore, no special significance should be attached to these particular values — any suitable values will do.

It is assumed that the oscillator 110 feeds a low frequency signal having 5 volts through the transformer 112 to the bridge 114. An unbalance occurs if there is a capacity change of $5\mu\mu f$. at the antenna 121. The energy passed through the transformer 126 causes 1 volt to appear at the base of the first transistor in amplifier 115. After having been amplified at 115, 117, and rectified at 116, this same voltage is applied as an 8-volt signal to the high and low level switches 118, 119. The normally operated low level relay 128 releases if this applied voltage drops to 7.8 volts, and the normally unoperated high level relay 129 operates if this voltage rises to 8.2 volts.

Under the foregoing assumptions, the depth of field adjustment cannot be allowed to cause any significant change in the 8 volt because that would set off an alarm. Thus, the usual volume control which raises or lowers the output voltages is not suitable for adjusting the depth of field.

The means for providing the depth of field adjustment, depends upon the distribution of voltages of the bridge 114. In greater detail, the amplifier 115 includes three cascaded stages, comprising the common emitter transistors 175, 176, 177, designed to give the amplifier 115 a very narrow, stable, and sharply defined bandpass characteristic. Therefore, the amplifier 115 serves the functions of providing a gain and a narrow band-pass filter tuned to the frequency of oscillator 110. An advantage is that the signal-to-noise ratio is greatly improved because the noise is either outside the narrow band-pass or it has a voltage which is very small as compared with the voltage of the signal. While the nature of the noise sources is immaterial, it might be well to note that they may either be picked up on the antenna from nearby generators (such as AC applicances) or appear in the power source.

More particularly, the coupling transformer 126 has a relatively high Q AC impedance to increase the sharpness of the frequency response. A variable resistor 179 is coupled across the secondary winding of the transformer 126 to lower the Q or AC impedance by a selective amount. When the entire resistance 179 is connected across the secondary winding, the full Q appears. At the other extreme the resistance 179 is low, and the transformer Q or AC impedance is also low.

Next, assume that the operator wishes to adjust the depth of the antenna field to be much smaller, say distances measured in inches. The resistor 179 is adjusted so that the secondary winding of the transformer 126 is shunted by a very low resistance, thus lowering the Q or AC impedance. This would, of course, cause the low level relay 128 to release; therefore, it will be necessary to readjust the bridge in order to restore the adjusted balance and reoperate the relay 128. Therefore, the impedance 120 is readjusted until the meter 127 returns to the midscale reading which represents the receipt of 8 volts at the inputs of the high and low switches 18, 19. Thus, say 3.5 volts at transformer 126 may deliver 1 volt to the base of transistor 175. Hence, adjustments of the potentiometer 179 and impedance 120 makes a larger or smaller depth of field and a constant 8-volt control signal appears at the inputs of the switches 118, 119.

The remaining components in the first stage of the amplifier 115 comprise a noise bypass decoupling capacitor 181 which also cooperates with resistor 182 to provide a negative feedback. The RC network 183 provides another negative feedback. Resistor 184 provides emitter bias, resistor 185 is a collector load, and capacitor 186 is a coupling between the stages.

The remaining two stages (which include the transistors 176, 177) are essentially the same as the described amplifier stage including the transistor 175, except for the capacitors. The noise bypass and degenerative feedback, provided via the capacitor 181 and the base-to-collector capacitors (such as 183) in each of the three stages of amplifier 115, cause the narrow band-pass characteristics which help suppress the noise and improve the signal-to-noise ratio. The capacitor 189 connects the amplifier 115 to the detector 116.

The detector 116 includes a load resistor 190, a rectifier 191, two smoothing capacitors 192, and a resistor 193 which reduces ripple. A voltage divider 194, 195 applies a base bias potential to PNP transistor 196. The input signal to the detector 116 is rectified at 191 and smoothed at 192, 193 to provide a DC potential which is added to the bias at the base of the transistor 196. When the antenna bridge 114 is in adjusted balance, a signal of 8 volts and an average current reaches the base of the transistor 196, point c on the curve. The needle points at zero. If the bridge thereafter becomes unbalanced in one direction, less current flows through the diode 191, the voltage at the base of transistor 196 falls to less than 7.8 volts (the point a, or less), and the meter needle swings outside the crosshatched zone. If unbalance is in the other direction, the potential changes so that more current flows through the diode 191, the voltage at the base of transistor 196 goes over 8.2 volts, and current rises to point b or above.

The DC amplifier 117 includes four transistor stages which amplify any changes occurring in the detector circuit 116. These transistors are, alternately, PNP, NPN, PNP, and NPN with sefl-compensating connections (for small leakage and temperature related currents, i.e. if one transistor begins to conduct more current, it lowers the bias on the next transistor, thus causing it to conduct less current). There is no comparable effect upon the large signal currents.

In greater detail, the first stage includes the transistor 196, an emitter bias resistor 197, and a load resistor 198. The collector of transistor 196 is coupled to drive current into the base of a common emitter transistor 200 which has a collector load resistor 201 and an emitter bias resistor 202. The collector of transistor 200 is, in turn, connected to the base of a transistor 205, having a collector load 203, and an emitter bias resistor 204. Finally, the transistor 205 drives an NPN transistor 206 used in a common emitter configuration and having an emitter bias resistor 207. The collector of transistor 206 is coupled to drive the meter 127, an RC circuit 208, and the high and low level switches 118, 119 respectively. The RC circuit 208 provides a load resistor and a noise bypass capacitor. Since each of the transistors in DC amplifier 117 stabilizes the small leakage and temperature currents the transistor in the next succeeding one of the four cascaded stages, only the transistor 196 needs to be selected with great care. I prefer to use one encapsulated in a small oven, the heat of which is designed to swamp out any ambient environmental temperature changes.

The two switching circuits 118, 119 are provided to respond to the high and low levels of current $b$, $a$, respectively, which result from either of the two possible unbalanced bridge conditions. These switches are energized via gating diodes 210, 211, respectively. Since these two switching circuits are the same except for the biasing required for the high and low scale response, only the low level switch 119 is described herein in detail.

Two common emitter transistors (a PNP and an NPN) are shown at 212, 213, respectively. The base of the PNP transistor 212 is connected to the collector of transistor 206 via the input isolation diode 211. The emitter of the transistor 212 is biased by an adjustable series of resistors 214 which set the low level voltage threshold response switch 119, in the assumed case of 7.8 volts at the anode of the diode 211.

The collector load for the transistor 212 is provided by the resistor 215. A resistor 216 couples the collector of the transistor 212 to the base of the transistor 213. The diode 217 clamps the emitter of the transistor 213 slightly above ground potential, and the resistor 218 cooperates with the resistors 214 to divide a voltage and provide a bias for the emitter of the transistor 213. The collector load for the transistor 213 is provided by the resistor 220.

The circuit values and configurations are such that the transistor 212 provides a high gain and the transistor 213 provides a fast switching response. The principle is that the transistors 212, 213 snap "on", and the transistor 213 drives itself into saturation, whenever the voltage at its emitter is less than the voltage at the collector of the transistor 206.

The collector of the transistor 213 is coupled via a resistor 221 to the base of an emitter follower 222. The emitter of the transistor 222 is, in turn, coupled to the relay 128 by way of a load limiting resistor 223. The emitter follower configuration is used at 222 since it provides a good isolation between the switching transistors 213 and the output relay 128. When the transistor 212 turns on responsive to an adjusted balance of the bridge 114, current flows through the winding of the relay 128. This relay operates and closes its contacts 224 to prepare an alarm device 225. When the transistor 222 turns off responsive to an unbalanced bridge, the alarm 225 goes off. The alarm is here shown as an exemplary lamp. However, an audio sounder device, or a "red button" machine tool stop signal could also be shown.

Similar contacts 226 in the high level switch 118 are also wired to enable the controlled circuit operation. For example, a punch press may operate if contacts 226 are open and stop if they are closed.

Figure 4:
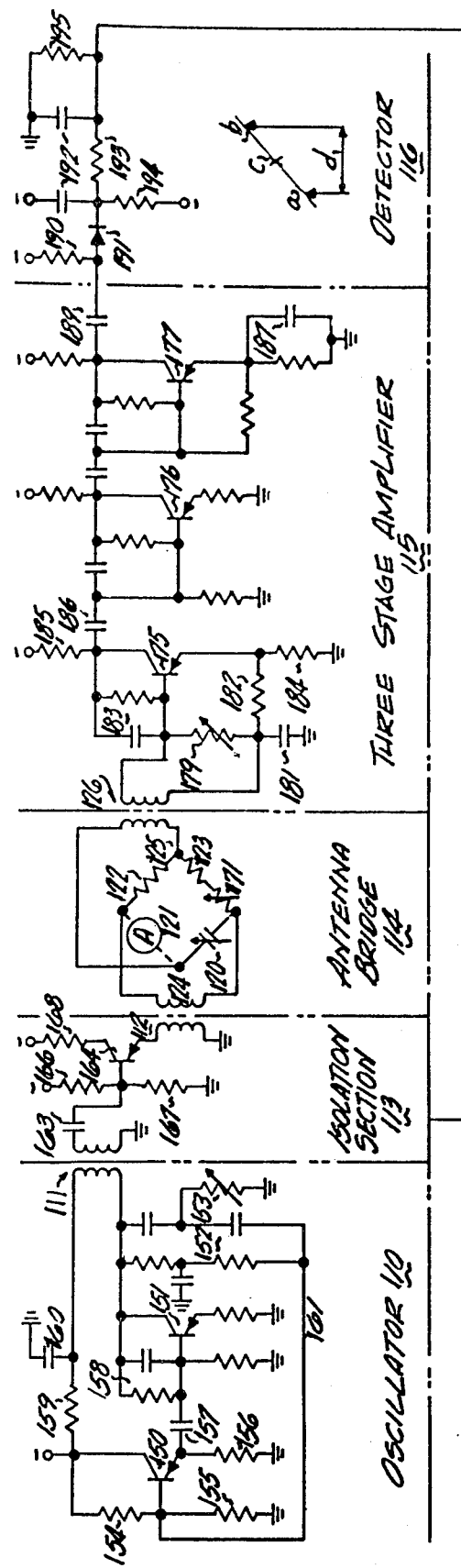
FIG. 4 is a schematic circuit diagram of the proximity sensor shown by the block diagram of FIG. 3 and described in my prior patent.
Figure 4:
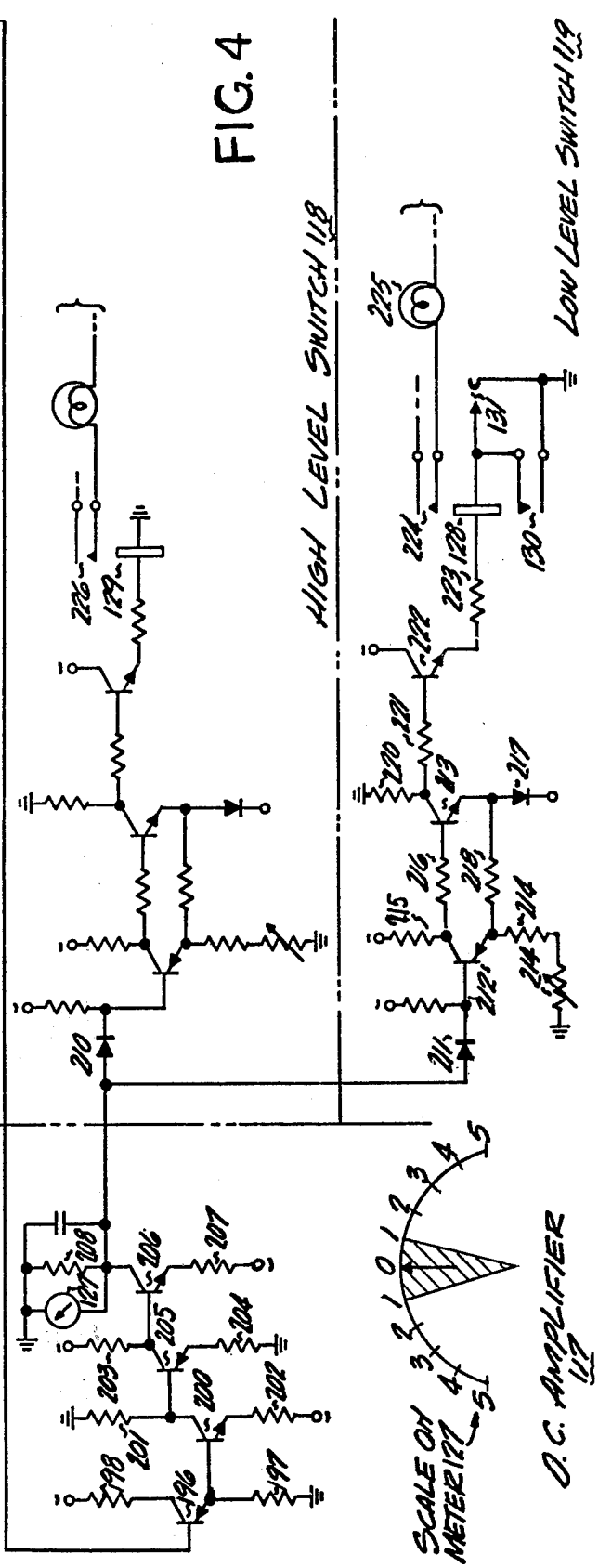

The proximity sensor circuit of FIG. 4 operates in this way. Responsive to an unbalanced bridge condition, the current through the diode 191 either increases or decreases, depending upon the direction of unbalance. This causes the DC amplifier 117 either to turn off the low level switch 119 when the current through diode 191 drops or to turn on the high level switch 118 when this current increases.

In greater detail, assume that the bridge 114 is unbalanced so that less current flows through the diode 191, and it reaches the trigger point $a$. The way diode 191 is poled, a current of positive polarity is driven into the base of the transistor 196. As the current decreases, the base of the PNP transistor 196 becomes less positive, and it starts to conduct more current. Its emitter becomes more negative as current increases. This makes the base of the NPN transistor 200 more negative, and it begins to conduct less current. As current drops in resistor 201, the base of the PNP transistor 205 becomes more positive. This decreases the current in the transistor 205, and its collector becomes more negative.

As the base of the NPN transistor 206 moves negative, its emitter-collector current decreases and less current flows from the negative source through the resistor 207 to the diodes 210, 211. Less negative current is driven into the base of the PNP transistor 212, and it begins to turn off. As the current through the resistor 215 decreases, the base of the NPN transistor 213 becomes less positive. Its current drops, and the base of the NPN transistor 222 moves toward the positive voltage applied through resistors 220, 221. The transistor 212 turns off and releases the relay 128. The contacts 224 open to turn off the lamp 225, stop a machine, or perform another control function.

The converse happens when the current in diode 191 raises to the level $b$, and the high level relay 129 operates.

According to the invention, means are provided for mixing the outputs from each of the various types of said sensing devices. In greater detail, the sensors 121A are connected into the bridge circuit 114 in such a manner that any sensed condition unbalances the bridge in the same manner that an unbalance of the antenna field unbalances the bridge. Moreover, as is apparent from FIGS. 1 and 2, there must be means for interconnecting a plurality of the sensors 121A to the bridge 114 without interfering with operation of the antenna. For present purposes, each of the sensors 121A may be thought of as a corresponding one of the photocells 30 (FIG. 1).

FIG. 5 shows a circuit used to connect any suitable number of discrete sensors (here three) 30a–30c to bridge 114, in parallel with antenna 121, if necessary. Here, each sensor 30 is a photoelectric cell which becomes conductive in the presence of light and non-conductive in the absence of light. Thus, for example, point 300 is at a negative battery potential whenever light strikes photocell 30a to make it conductive. In darkness, the point 300 is at the potential on bus 304 as set and regulated by a Zener diode 305 and its series connected bias resistor 306, which is connected to ground 307. Likewise the points 301 and 302 are at either negative or bus 304 potential, depending upon whether light does or does not strike photocells 30b, 30c, respectively.

If some other form of sensor, such as an ultrasonic sensor, a microswitch, or the like, is used, the principle is the same. The voltage at any one or more of the points 300–302 varies between negative or bus 304 potential, as a function of sensed conditions.

Under normal conditions, all of the sensors 30a, 30b, 30c receive light (see FIGS. 1, 2) and all of the points 300–302, are at a negative potential. In the presence of such negative potential, no current flows in any of the diodes 308–310 which are coupled between the points 300–302 (respectively) and the base of an NPN transistor 315, which is thereby biased off.

If light is removed from any one or more of the photocells 30, it in effect becomes an open circuit thereby substituting a positive for the negative potential. In greater detail, assume that a worker's hand interrupts the lowermost light beam 22 (FIG. 1) and photocell 30a becomes dark. Negative potential is removed from the potential point 300 and a less negative potential is applied from bus 304 through diode 308 and current flows into the base of the transistor 315, causing it to switch on.

Before transistor 315 turns on, its collector stands at the ground potential 318 and its emitter stands at the negative potential 319. When transistor 315 turns on, the voltage between ground 318 and battery 319 is divided across resistors 316, 317. Therefore, the transistor 315 collector becomes relatively more negative and its emitter becomes relatively more positive. With these potential changes, current flows into the bases of transistors 320, 321, and each turns on. Resistor 322 limits current and couples the collector of transistor 315 to the base of transistor 320. The emitter of transistor 320 is biased from ground 323 applied through diode 324. The collector of transistor 320 is connected to battery through a noise filter 325 for eliminating wild voltage spikes.

Before transistors 315, 320 turn on, the current through diode 324 flows through resistors 326, 317 to negative battery 319. After transistor 320 turns on in response to the turning on of transistor 315, the current of diode 324 flows through the emitter of the transistor 320, driving it on with a snap action somewhat similar to the action of a Schmitt trigger. The use of the diode 324 current assisted switch on is preferred over a Schmitt trigger since a Schmitt trigger fires at different potentials which vary as a function of the junction temperature.

Feedback means are connected across the electronic switch formed by transistors 315, 320 to hold it on for a period of time which is long enough to insure an output response by an alarm means, (e.g. the machine of FIG. 1 may be shut down). In greater detail, after a current feeds back from the ground 323 through diode 324 and the emitter collector of transistor 320 through capacitor 330 to the base of the transistor 315, it holds a switched on condition for at least a minimum period of time which is adequate to insure proper operations of the relays 128 and 129 (FIG. 3) and any response thereto.

The potential of ground 323 is also applied through diode 324 and the emitter-collector of transistor 320, diode 335, resistor 336, and coaxial connector 337 to bridge 114. Ground is now applied to both resistor 122 and capacitor 120, thereby shorting out one arm of the bridge 114. This short circuit in the bridge triggers a detection of the interruption of the light beam at sensor 30a.

The impedances of diode 335 and resistor 336 are very high so that neither bridge 114 nor the antenna 121 "sees" the isolation unit 124, except when a sensed condition occurs.

The potentials applied to the bridge have exactly the same effect, regardless of whether they originate at antenna 121 or sensor 121A. Also, the drawing shows sensors 30 as photocells. However, any kind of sensor may be used as long as it can switch potentials at the points 300, 301, 302 responsive to the sensed conditions.

By an inspection of FIG. 1, it is apparent that a careful alignment is required for the fixtures 27, 28. If the light is not properly directed onto the photocells 30a–30c, or if there are marginal adjustments, obviously the machine will not operate or will fail to function properly. These non-alignment problems present a number of considerations. If it is necessary to attempt to run the machine to see whether the lights are properly aligned, there is a danger that someone might become careless on, say, the tenth try if the machine has previously failed to start on nine successive tries because of misaligned lights and photocells. Or, there may be damage to the machine if it is run empty or a waste of material if it actually makes a part during the alignment test conditions. If the alignment leads to erroneous appearances of failure under marginal conditions, the worker may soon become frustrated and do something foolish such as disconnect or bypass the safety equipment.

To forestall these and other problem conditions, the invention provides a detector and indicator which help detect proper alignment. In greater detail, the transistors 321, 345 are connected to respond to potentials on the emitter of the transistor 315. Resistor 346 is a collection load extending from the NPN transistor 321 to ground 323. Resistor 347 is a coupling between the collector of transistor 321 and the base of transistor 345. The lamp 31 is the collector load for the transistor 345. The lamp 31 is dark when light falls on all photocells 30 and is lit when any one or more of the photocells 30 are dark.

The circuit operates this way. Assume first that light falls on all photocells 30. Each photocell conducts. The relatively negative potential is applied through all photocells to the anodes of diodes 308–310 which are thereby biased off. Transistor 315, 320, 321 are switched off. With transistor 321 switched off, ground 323 is applied through resistors 346, 347 to the base of transistor 345 which is switched off. Thus, the lamp 31 is dark.

Next, assume that any one or more photocells (photocell 30a, for example) is darkened as when someone places his hands in front of one or more of the light beams 22–26 (beam 22, FIG. 1, for example). The darkened photocell stops conducting and potential point 300 (in this assumption) becomes the more positive voltage on bus 304, as regulated by the Zener diode 305. The diode 308 conducts and current is driven into the base of NPN transistor 315, which switches on.

Responsive to the switch on of the transistor 315, the voltage between 318 and 319 divides across the resistors 316, 317 (the resistance 316 is preferably about ten times greater than the resistance 317). Also, when transistor 315 switches on, the current from ground 323 through diode 324 switches from a path through resistors 326, 317 to the emitter of the transistor 320. This surge of current into the transistor 320 emitter coincides with the application of the negative potential 319 applied from the transistor 315 collector to the base of transistor 320. Thus, transistor 320 comes on with a snap action and at a potential which does not vary as a result of any variations in junction temperature. The bridge 114 is shorted by the potential of ground 323 applied through transistor 320, diode 335 and resistor 336. The interrupted light beam is thus detected by the circuit of FIG. 4. A signal feeds back through capacitor 330 to hold the transistor 315 on for a period which is long enough to insure an alarm response (i.e. relay operation) to the unbalanced bridge.

Also, responsive to the operation of the switching on of transistor 315, the transistor 321 turns on to apply negative battery to the base of the transistor 345 which turns on. This applies the ground 323 to light lamp 31.

The lit lamp 31 indicates that one of the photocells is darkened.

Those who are skilled in the art will readily perceive various modifications which may be made in the above disclosed structure. Therefore, the appended claims are to be construed to include all equivalent structures falling within the scope and the spirit of the invention.

I claim:

1. A proximity sensor comprising an intermixed plurality of different types of simultaneously operating sensing devices including at least an RF antenna and connected in parallel with at least one off/on switching sensors means for simultaneously mixing the outputs from each of the various types of said parallel connected sensing devices, and detector means including a common circuit operated responsive to the output of said mixing means for giving an alarm signal responsive to a change in an output signal from any one of said sensing devices.

2. The sensor of claim 1 wherein there are a plurality of said switching sensors, each of said sensors being a photocell, said plurality being any one of many different numbers of said photocells, an electrical isolation circuit unit means, means for connecting each of said photocells into the input of said electrical isolation circuit unit, bridge means, and means for connecting said isolation circuit unit to said bridge in a parallel connection with said antenna, whereby different numbers of photocells may be lit or dark without adversely affecting sensor operation.

3. The proximity sensor of claim 2 wherein one type of said sensing devices comprises said RF antenna which is capacitively coupled to its environment, another type of said sensing devices comprises said photocells, and said mixing means comprises said a bridge which is balanced when said antenna is capacitively coupled into a quiescent environment and light is falling on said photocells, and which is unbalanced responsive to any changes in the environment which alter said capacitive coupling or responsive to the on/off switching of any one of the photocells when it is darkened.

4. A proximity sensor comprising an intermixed plurality of different types of simultaneously operating sensing devices including at least an RF antenna and a plurality of off/on switching photocell sensors, said RF antenna being capacitively coupled to its environment, electrical isolation circuit means, means for connecting each of said photocells into the input of said electrical isolation circuit means, means for connecting said isolation circuit means to a bridge in parallel with said antenna, said photocells being parts of a plurality of parallel circuits, said isolation unit comprising an electronic switch connected in series with said parallel circuits, high impedance means for connecting the electronic switch to, but electrically isolating it from, said antenna, means for simultaneously mixing the outputs from each of the various types of said sensing devices, said mixing means comprising said bridge which is balanced when said antenna is capacitively coupled into a quiescent environment and said photocells are lit and which is unbalanced responsive to any changes in the environment which alter said capacitive coupling or responsive to the on/off action of any one of the photocells when it is darkened, and detector means including a common circuit operated responsive to the output of said mixing means for giving an alarm signal responsive to a change in an output signal from any one of said sensing devices.

5. The sensor of claim 4 and feedback means connected across the input and output of said electronic switch to hold it on for a period of time which is long enough to insure an output response by said detector means.

6. The sensor of claim 5 and machine tool means, and means responsive to said alarm signal for shutting down said machine tool means.

7. A proximity sensor comprising an antenna capacitively coupled into its environment, at least on other sensing device comprising any one of many different numbers of photocells connected in parallel with the antenna, isolation circuit means, means for connecting said photocells between one potential and the input of said isolation circuit unit, said one potential being an off bias clamp for said isolation circuit, means responsive to an operation of at least one of said other sensing devices for substituting an on bias for said off bias clamp, means for connecting said isolation circuit unit in parallel with said antenna, a common circuit responsive to both said antenna and said photocells, said common circuit comprising means for simultaneously mixing the outputs from the photocell and the antenna, detector means for simultaneously monitoring said photocells and said antenna and for operating responsive to the output of said mixing means, means for giving an alarm signal responsive to the output of either said antenna or said sensing device applied through said mixing means, machine tool means, and means responsive to said alarm signal for shutting down said machine tool means.

8. The proximity sensor of claim 7 wherein said photocells are positioned to receive light beams extending across the working access area of said machine tool and said antenna is strung around the perimeter of said machine tool which is outside of said working access area.

9. The proximity sensor of claim 7 wherein said antenna is strung along a path followed by work pieces as they pass through said machine tool and said photocells are positioned to guard against the intrusion of a worker into danger areas of said machine tool.

10. The proximity sensor of claim 7 wherein said photocells guard worker gate areas to said machine tool and said antenna guards other danger areas of said machine tool.

* * * * *

UNITED STATES PATENT AND TRADEMARK OFFICE
CERTIFICATE OF CORRECTION

PATENT NO. : 3,967,261

DATED : June 29, 1976

INVENTOR(S) : Solly L. Fudaley

It is certified that error appears in the above–identified patent and that said Letters Patent are hereby corrected as shown below:

Col. 5, line 32, after "associated" insert --meter--;
col. 6, line 19, change "115" to --150--; col. 8, line 41,
change "sefl-compensating" to --self-compensating--.

Signed and Sealed this

Fourteenth Day of December 1976

[SEAL]

Attest:

RUTH C. MASON
*Attesting Officer*

C. MARSHALL DANN
*Commissioner of Patents and Trademarks*